United States Patent [19]
Uehara

[11] Patent Number: 6,019,121
[45] Date of Patent: Feb. 1, 2000

[54] PRESSURE REDUCING VALVE

[75] Inventor: Teruo Uehara, Ibaraki-ken, Japan

[73] Assignee: SMC Kabushiki Kaisha, Tokyo, Japan

[21] Appl. No.: 09/142,050

[22] PCT Filed: Dec. 24, 1997

[86] PCT No.: PCT/JP97/04796

§ 371 Date: Sep. 4, 1998

§ 102(e) Date: Sep. 4, 1998

[87] PCT Pub. No.: WO98/30944

PCT Pub. Date: Jul. 16, 1998

[30]         Foreign Application Priority Data

Jan. 7, 1997   [JP]   Japan .................................. 9-000992

[51] Int. Cl.[7] ........................... G05D 11/00; F16K 31/12; E03B 25/09
[52] U.S. Cl. .................... 137/116.5; 137/505.15; 137/489; 137/492; 137/906
[58] Field of Search ........................ 137/116.5, 505.15, 137/489, 492, 906

[56]           References Cited

U.S. PATENT DOCUMENTS

| | | | |
|---|---|---|---|
| 2,747,599 | 5/1956 | Watson | 137/116.5 |
| 2,806,481 | 9/1957 | Faust | 137/116.5 |
| 2,977,966 | 4/1961 | Matthews | 137/66 |
| 3,001,535 | 9/1961 | Mueller | 137/51 |
| 3,102,549 | 9/1963 | Worden et al. | 137/116.3 |
| 3,115,147 | 12/1963 | Mueller | 137/116.5 |
| 3,926,204 | 12/1975 | Earl | 137/116.5 |

*Primary Examiner*—Henry J. Recla
*Assistant Examiner*—Peter deVore
*Attorney, Agent, or Firm*—Oblon, Spivak, McClelland, Maier & Neustadt, P.C.

[57]           ABSTRACT

A pressure reducing valve 30 comprises a body unit 32, a bonnet unit 36, and an operating unit 38 having a handle 126. The pressure reducing valve 30 further comprises a first diaphragm 84, a second diaphragm 86, a third diaphragm 100, and a fourth diaphragm 102 which are provided to extend in the body unit 32 while being separated from each other by predetermined spacing distances, and a nozzle 106 and a flapper 110 which are arranged in a third diaphragm chamber 116.

8 Claims, 13 Drawing Sheets

PRESSURE REDUCING VALVE

TECHNICAL FIELD

The present invention relates to a pressure reducing valve for reducing the pressure of a pressurized fluid supplied from the primary side to a desired pressure and discharging the fluid to the secondary side.

BACKGROUND ART

In general, when a pressurized fluid is supplied at a desired preset pressure from a pressurized fluid supply source to a pressurized fluid-driven apparatus, a pressure reducing valve is installed between the pressurized fluid supply source and the pressurized fluid-driven apparatus. The pressure reducing valve is operated such that the pressurized fluid on the primary side, which is supplied from the pressurized fluid supply source, is subjected to pressure reduction to a predetermined pressure suitable for the pressurized fluid-driven apparatus connected to the secondary side, and the fluid is supplied to the secondary side.

A pressure reducing valve, which has been suggested by the present applicant, is shown in FIG. 13.

The pressure reducing valve 1 comprises a main body unit 4 formed with a primary port 2 used to make connection on the side of a pressurized fluid supply source and a secondary port 3 used to make connection on the side of a pressurized fluid-driven apparatus, a bonnet 6 integrally coupled to the main body unit 4 and including a spring member 5 formed therein, and a handle 7 provided rotatably on an upper portion of the bonnet 6.

A central exhaust port 8 is formed at one side surface of the main body unit 4. The central exhaust port 8 functions as a bleed port for discharging an excessive amount of the pressurized fluid supplied from the primary port 2 to the atmospheric air, and it is also used as an exhaust port for discharging the pressurized fluid on the secondary side at a pressure higher than a preset pressure to the atmospheric air.

A first diaphragm 9, a second diaphragm 10, and a third diaphragm 11 are provided to extend at the inside of the main body unit 4. Those provided between the first diaphragm 9 and the second diaphragm 10 include a first diaphragm chamber 12 which communicates with the secondary port 3 via a first passage 12a, a nozzle back pressure chamber 13 which is formed separately from the first diaphragm chamber 12, and a flapper 14 and a nozzle 15 which perform seating operation or make separation from each other in accordance with an action of the pressurized fluid introduced into the nozzle back pressure chamber 13.

A second diaphragm chamber 16, which communicates with the central exhaust port 8, is provided between the second diaphragm 10 and the third diaphragm 11. On the other hand, a third diaphragm chamber 17 is provided under the third diaphragm 11. A communicating hole 18 for communicating the second diaphragm chamber 16 with the third diaphragm chamber 17 is formed through the third diaphragm 11. A valve plug 19 is provided so that its one end engages with the communicating hole 18. The valve plug 19 is in a state of being urged upwardly by the aid of the resilient force of a spring member 20. A communicating passage 21 between the primary port 2 and the secondary port 3 is opened or closed when the valve plug 19 makes separation or seating with respect to a seat section. A second passage 22 for communicating the primary port 2 with the nozzle back pressure chamber 13 is formed in the main body unit 4.

The operation of the pressure reducing valve 1 will be schematically explained below.

The pressurized fluid is supplied from the primary port 2 in a state in which the nozzle 15 and the flapper 14 are separated from each other by a predetermined spacing distance without exerting the resilient force of the spring member 5. The pressurized fluid passes through the second passage 22, and it is introduced into the nozzle back pressure chamber 13. The pressurized fluid passes through the gap between the nozzle 15 and the flapper 14, and it is introduced into the first diaphragm chamber 12. The pressurized fluid, which has been introduced into the first diaphragm chamber 12, passes through the first passage 12a, the third diaphragm chamber 17, and the communicating hole 18 of the third diaphragm 11, and it is bled to the atmospheric air via the central exhaust port 8.

The handle 7 is rotated in a predetermined direction so that the flapper 14 is pressed downwardly by means of the resilient force of the spring member 5, in the foregoing bleeding state in which the excessive amount of the pressurized fluid passes through the secondary side and it is discharged from the central exhaust port 8 to the atmospheric air. Thus, the nozzle hole of the nozzle 15 is closed. The pressurized fluid, which is supplied from the primary port 2, passes through the second passage 22, and it is introduced into the nozzle back pressure chamber 13. Accordingly, the pressure (nozzle back pressure) in the nozzle back pressure chamber 13 is increased. The second diaphragm 10 is pressed downwardly in accordance with the action of the nozzle back pressure. The second diaphragm 10, the third diaphragm 11, and the valve plug 19 are displaced downwardly in an integrated manner, and the valve plug 19 is separated from the seat section. Thus, the primary port 2 is communicated with the secondary port 3.

As a result, the primary pressure is reduced in accordance with the pressure-regulating action of the third diaphragm 11, and the reduced pressure is supplied to the pressurized fluid-driven apparatus connected to the secondary side.

When the secondary pressure is increased to be not less than a preset pressure, then the first diaphragm 9 and the third diaphragm 11 are pressed upwardly, and the valve plug 19 is seated on the seat section. Further, the third diaphragm 11 is separated from the one end of the valve plug 19, and the communicating hole 18 is opened. Therefore, the pressurized fluid having a high pressure on the secondary side is discharged to the atmospheric air from the central exhaust port 8 via the communicating hole 18.

In this case, the pressurized fluid in the nozzle back pressure chamber 13 passes through the gap formed between the nozzle 15 and the flapper 14 in accordance with the action of upward movement of the first diaphragm 9. After that, the pressurized fluid passes through the secondary side, and it is discharged to the atmospheric air from the central exhaust port 8. Therefore, it is impossible to quickly decrease the nozzle back pressure. As a result, a problem arises in that it is impossible to improve the response speeds of the second diaphragm 10 and the third diaphragm 11 to be displaced in accordance with the action of the nozzle back pressure.

An object of the present invention is to provide a pressure reducing valve which makes it possible to quickly decrease the nozzle back pressure when the secondary pressure is increased to be higher than a preset pressure, so that the response speed is increased, and which makes it possible to further improve the exhaust characteristics (relief characteristics) of the pressurized fluid on the secondary side.

DISCLOSURE OF THE INVENTION

According to the present invention, when the secondary pressure is increased to be not less than a preset pressure, then the pressurized fluid in a nozzle back pressure chamber is allowed to pass through a gap between a nozzle and a flapper, and it is directly discharged to the atmospheric air via a bleed port. Thus, the nozzle back pressure in the nozzle back pressure chamber can be quickly decreased.

The quick decrease in the nozzle back pressure as described above makes it possible to set large displacement amounts for a first diaphragm and a second diaphragm, and it is possible to increase the response speed. Further, the exhaust characteristics (relief characteristics) of the secondary pressure are much more improved.

BEST MODE FOR CARRYING OUT THE INVENTION

Figure 1:
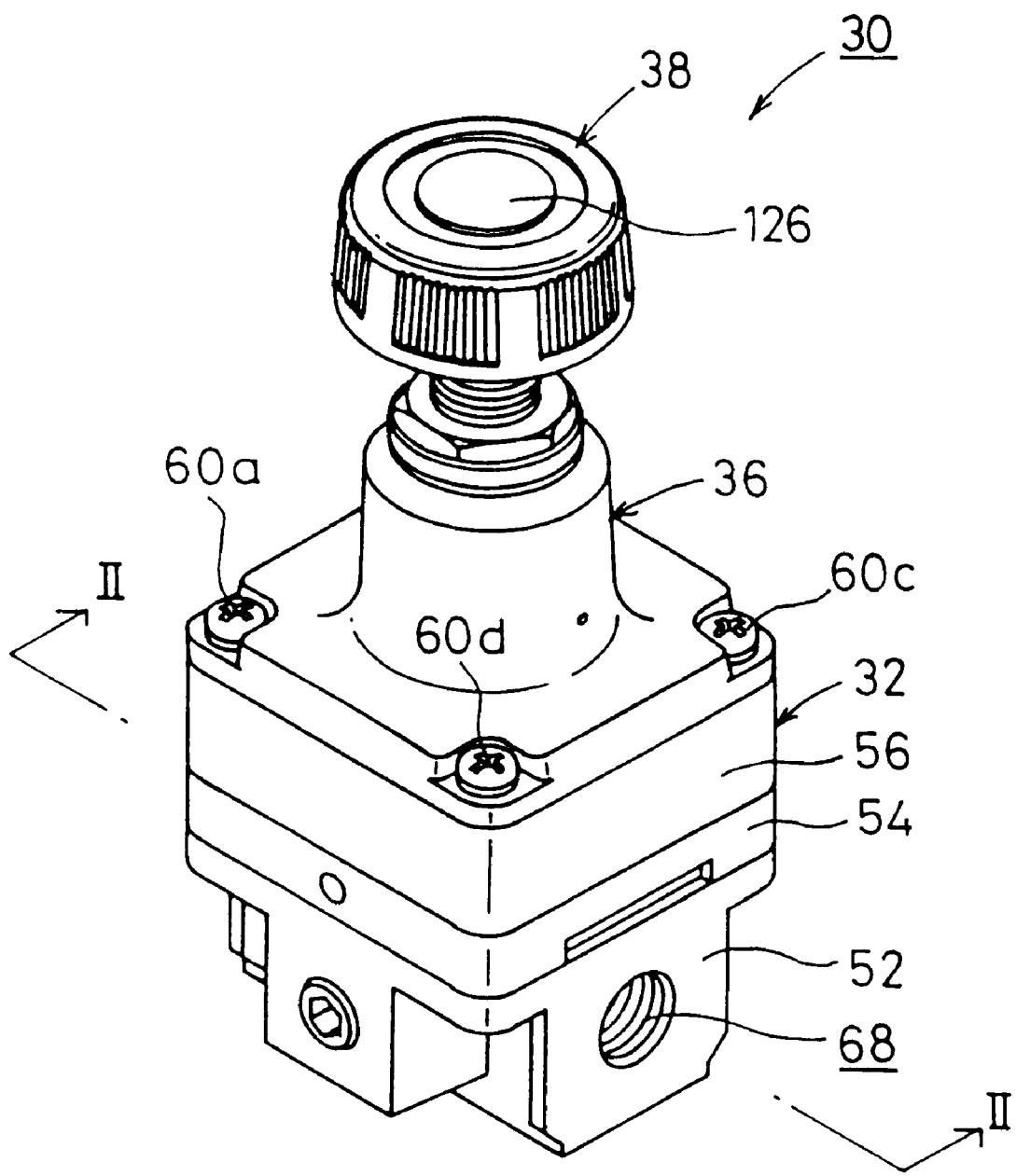
FIG. 1 shows a perspective view illustrating a pressure reducing valve according to an embodiment of the present invention.
Figure 2:
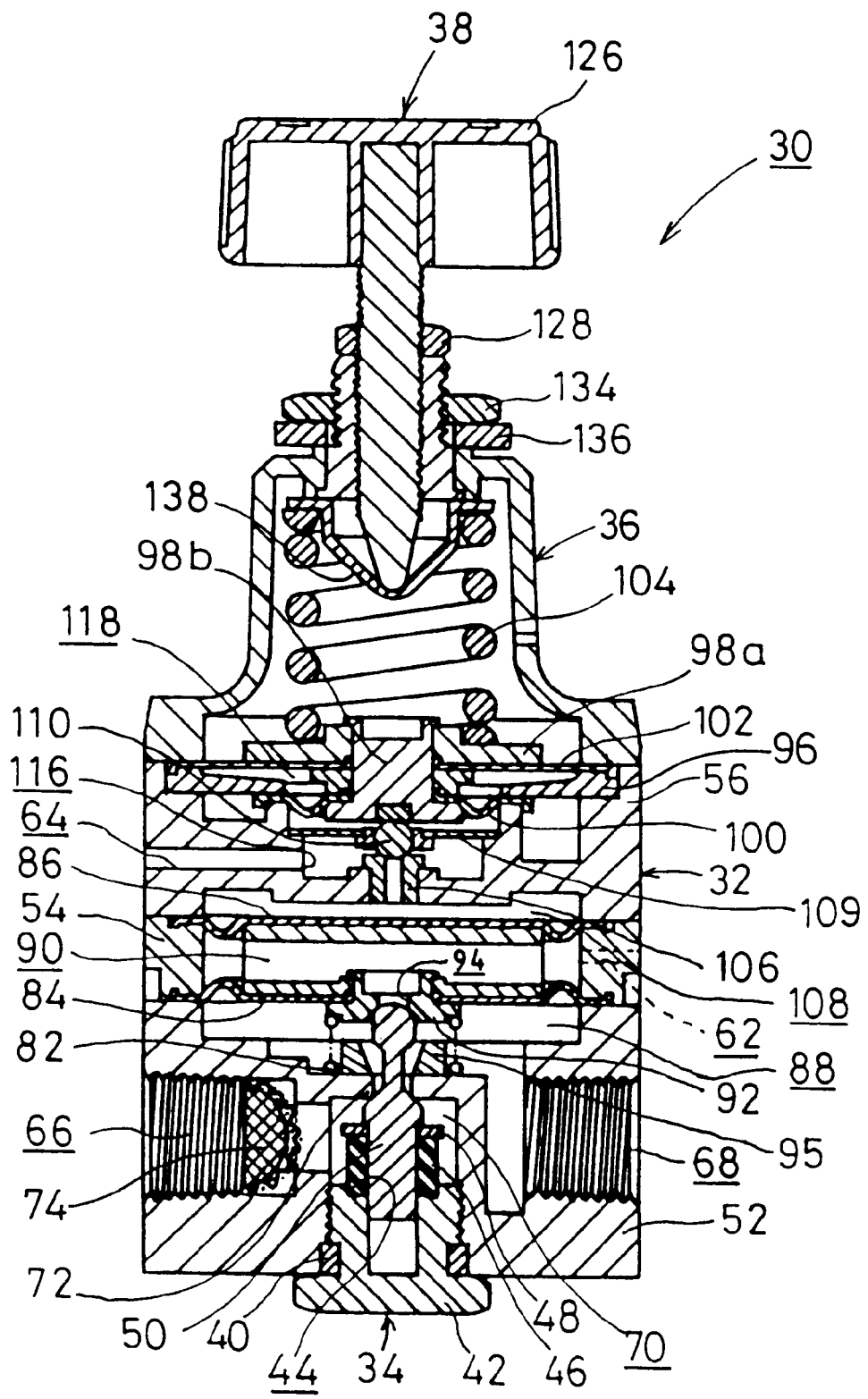
FIG. 2 shows a longitudinal sectional view taken along a line II—II shown in FIG. 1.

With reference to FIGS. 1 and 2, reference numeral 30 indicates a pressure reducing valve according to an embodiment of the present invention.

The pressure reducing valve 30 basically comprises a substantially rectangular parallelepiped-shaped body unit 32, a cover unit 34 (see FIG. 2) coupled to the lower portion of the body unit 32 in an air-tight manner, a bonnet unit 36 integrally coupled to the upper portion of the body unit 32, and an operating unit 38 provided rotatably on the upper portion of the bonnet unit 36.

Figure 3:
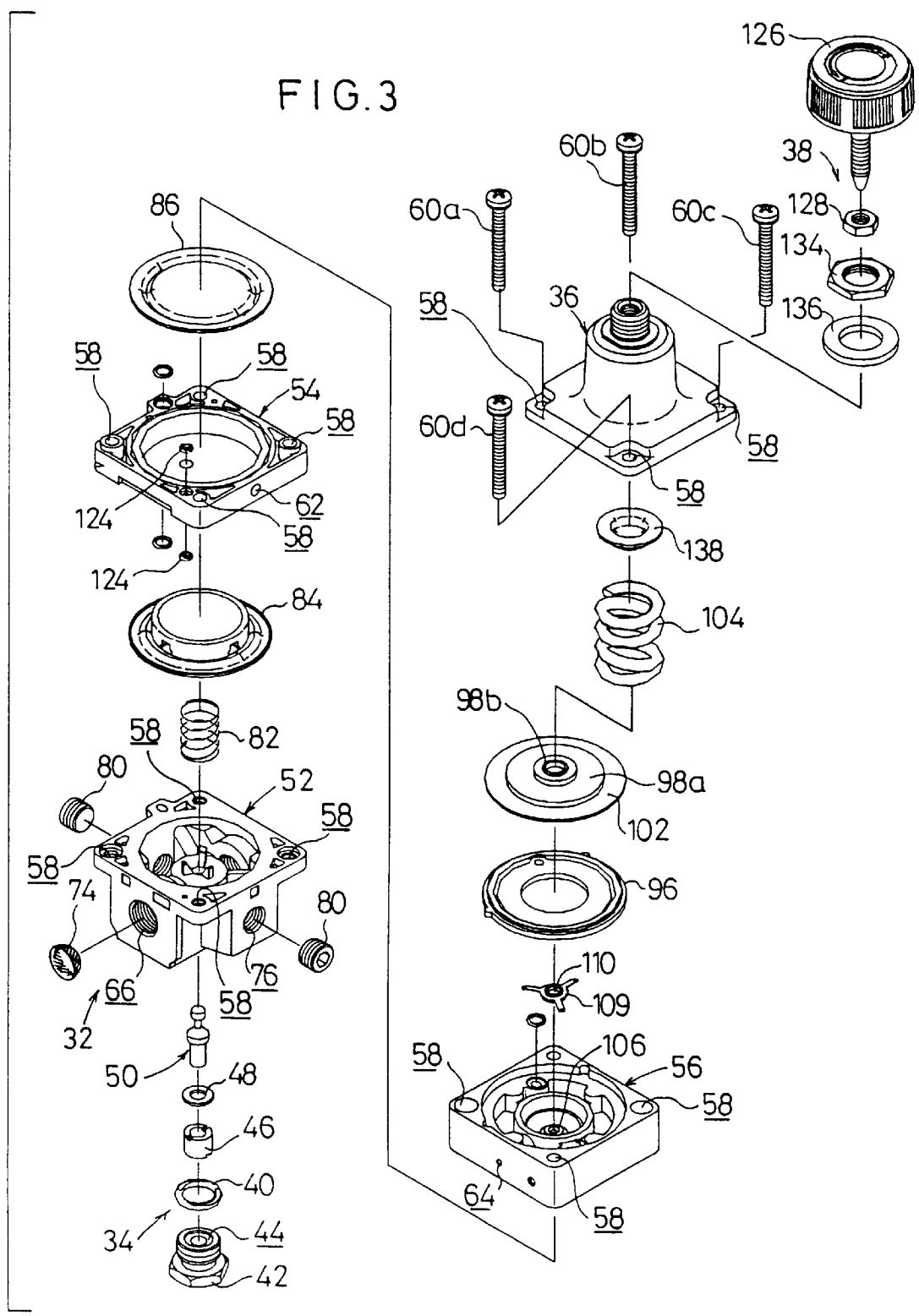
FIG. 3 shows an exploded perspective view illustrating the pressure reducing valve shown in FIG. 1.

As shown in FIG. 3, the cover unit 34 has a closing member 42 for closing, in an air-tight manner, a hole formed at the lower portion of the body unit 32 by the aid of an O-ring 40, a cylindrical damper member 46 supported by an annular groove 44 formed at one end of the closing member 42, and a valve plug 50 to which a washer 48 for engaging with the damper member 46 is externally fitted. In this embodiment, the valve plug 50 is provided vertically displaceably in accordance with the resilient force of the damper member 46 formed of a rubber material such as natural rubber or synthetic rubber.

As shown in FIG. 3, the body unit 32 comprises a first body 52, a second body 54, and a third body 56 which are formed to have block-shaped configurations. The first body 52, the second body 54, and the third body 56 are integrally assembled into one unit by means of four screw members 60a to 60d to be screwed into screw holes 58 formed at four corners respectively. The second body 54 is formed with an exhaust port 62. The third body 56 is formed with a bleed port 64. The exhaust port 62 and the bleed port 64 are provided separately from each other.

As shown in FIG. 2, a primary port 66 connected to a pressurized fluid supply source and a secondary port 68 connected to a pressurized fluid-driven apparatus are formed coaxially while being separated from each other by a predetermined spacing distance on mutually opposing both side surfaces of the first body 52. A communicating passage 70 for communicating the primary port 66 with the secondary port 68 is formed between the primary port 66 and the secondary port 68. The communicating state of the communicating passage 70 is blocked when the valve plug 50 is seated on a seat section 72. On the other hand, the communicating state is given when the valve plug 50 is separated from the seat section 72. A filter 74 is installed to a portion adjacent to the primary port 66.

Figure 6:
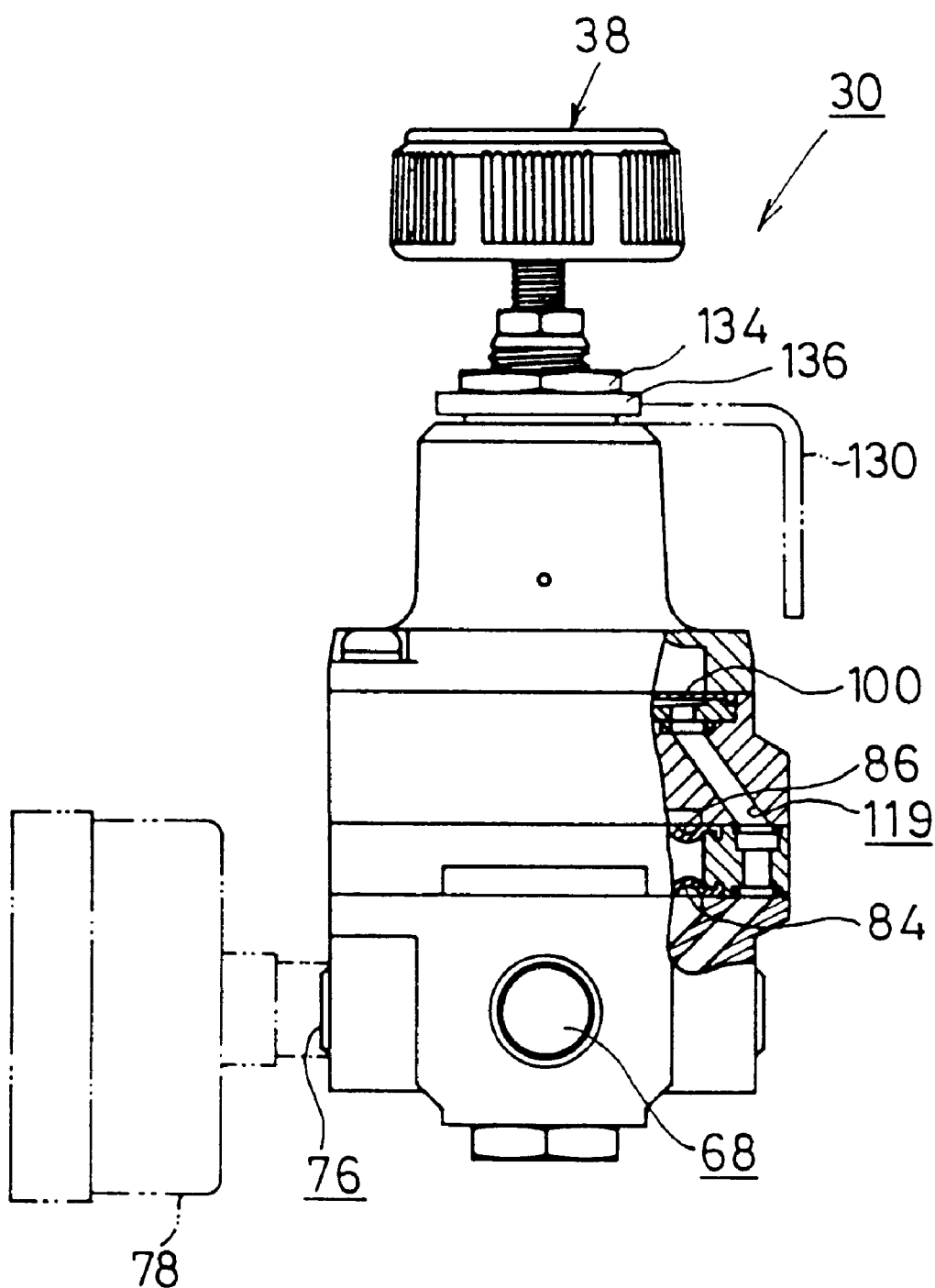
FIG. 6 shows a sectional view, with partial cutout, illustrating the pressure reducing valve shown in FIG. 1.

A pair of ports 76 are formed, which are disposed perpendicularly to an axis formed by connecting the primary port 66 and the secondary port 68. A pressure gauge 78 may be screwed into one of the pair of ports 76 so that the pressure of the pressurized fluid flowing through the communicating passage 70 may be detected (see FIG. 6). When the pressure gauge 78 is not used, plug members 80 are screwed into the pair of ports 76 respectively. Thus, the pair of ports 76 are closed in an air-tight manner (see FIGS. 3 and 4).

Figure 4:
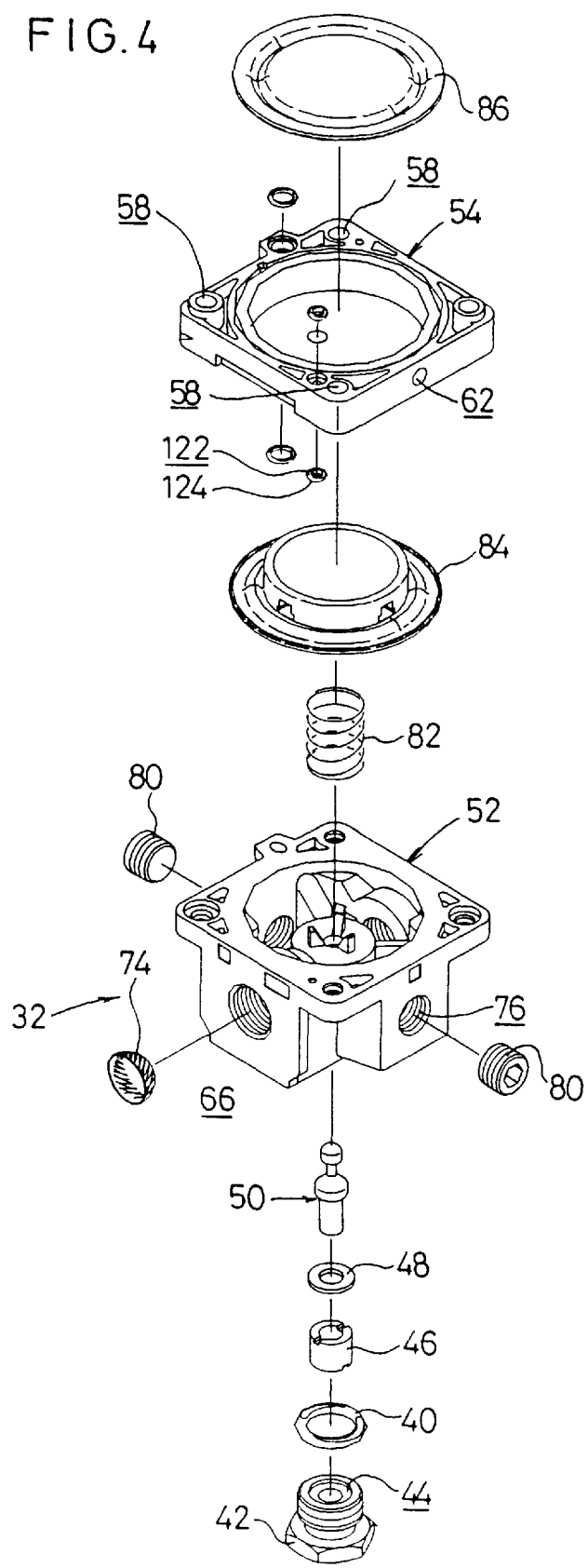
FIG. 4 shows a partial magnified view illustrating components shown in FIG. 3.

As shown in FIG. 4, a first diaphragm 84 is installed between the first body 52 and the second body 54 with a first spring member 82 interposed therebetween. The first diaphragm 84 is interposed and held by annular edges which are formed on the first body 52 and the second body 54 respectively. In the same manner as described above, a second diaphragm 86 is installed between the second body 54 and the third body 56. The second diaphragm 86 is interposed and held by annular edges which are formed on the second body 54 and the third body 56 respectively.

As shown in FIG. 2, a first diaphragm chamber 88, which communicates with the secondary port 68, is provided under the first diaphragm 84. A second diaphragm chamber 90, which communicates with the exhaust port 62, is provided between the first diaphragm 84 and the second diaphragm 86. A holding metal fixture 92, which is engaged with the head of the valve plug 50, is provided at the center of the first diaphragm 84. A through-hole 94, which makes communication between the first diaphragm chamber 88 and the second diaphragm chamber 90, is formed through the holding metal fixture 92. The first spring member 82, which presses the first diaphragm 84 upwardly by means of its resilient force, is provided in the first diaphragm chamber 88. A stopper 95 is formed to protrude on the upper surface of the first body 52 adjacent to the first spring member 82 so that the displacement of the holding metal fixture 92 is regulated.

Figure 5:
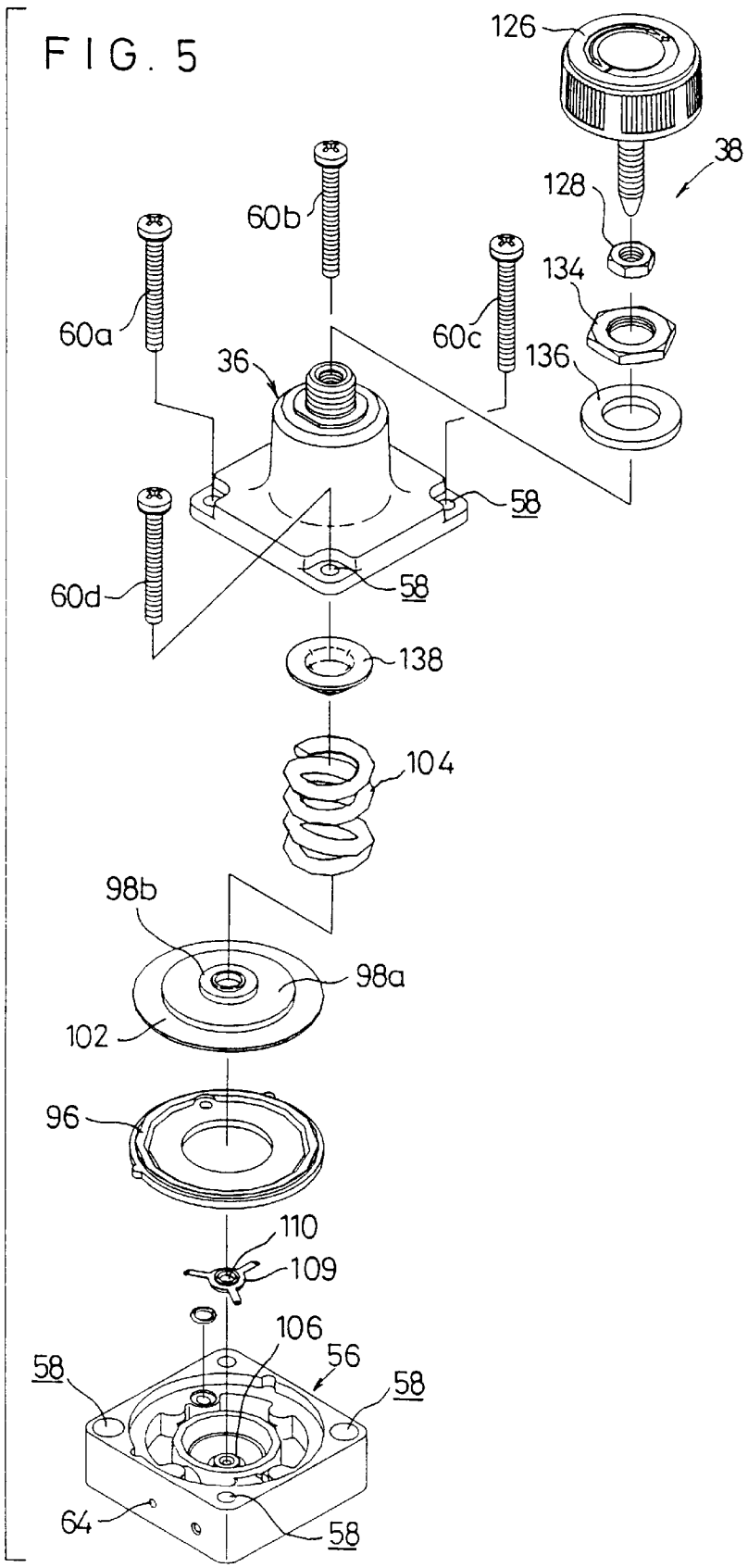
FIG. 5 shows a partial magnified view illustrating components shown in FIG. 3.

As shown in FIG. 5, those provided between the third body 56 and the bonnet unit 36 include a ring-shaped diaphragm-holding member 96, a third diaphragm 100 (see FIG. 2) and a fourth diaphragm 102 which have large and small different diameters and which are interposed by a pair of disk members 98a, 98b while being separated from each other by a predetermined spacing distance, and a second spring member 104 which engages with the upper surface of the disk member 98a to press the third diaphragm 100 and the fourth diaphragm 102 downwardly by means of its resilient force.

Figure 8:
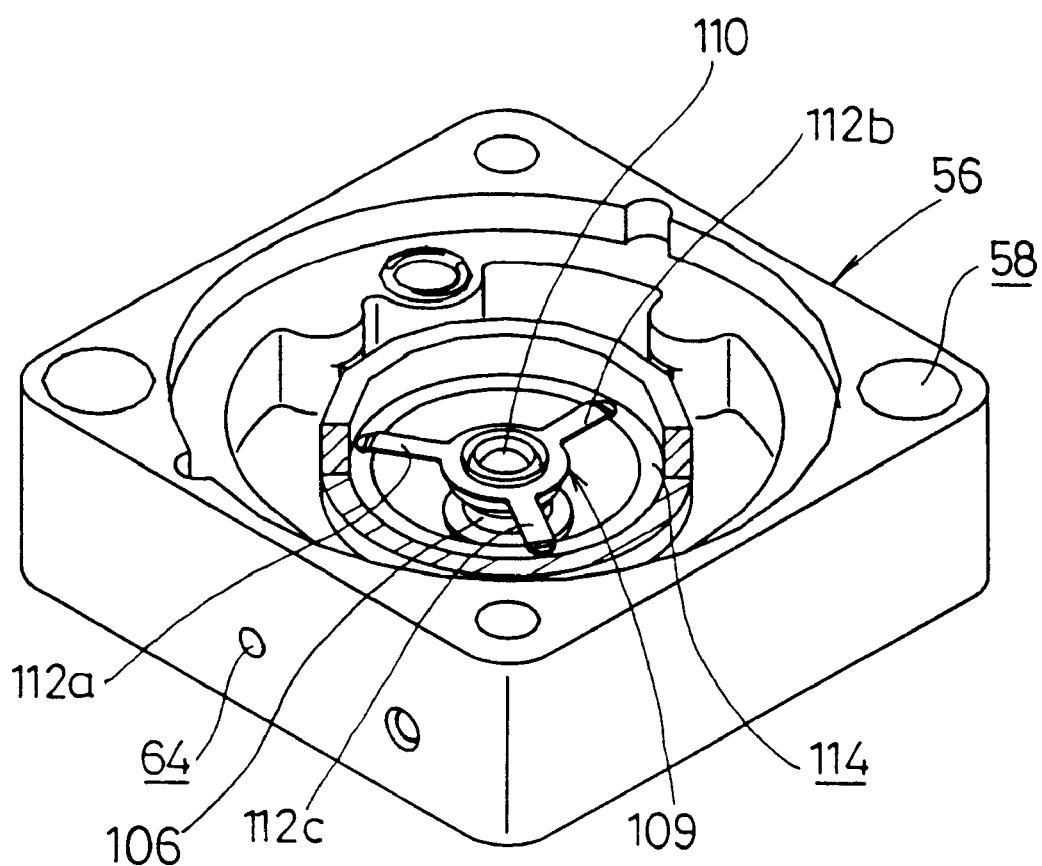
FIG. 8 shows a perspective view, with partial cutout, illustrating a retained state of a flapper.

A nozzle 106, which is formed with a nozzle hole, is arranged at the center of the third body 56. The nozzle hole is formed to make communication with a nozzle back pressure chamber 108 closed by the second diaphragm 86. In this embodiment, as shown in FIG. 8, a spherical flapper 110, which is held in a hole having a circular cross section of a plate spring 109, engages with the nozzle 106. The flapper 110 is provided so that it closes the nozzle hole or it is separated therefrom by a predetermined spacing distance in accordance with the action of the resilient force of the plate spring 109.

That is, the plate spring 109 has three pawls 112a to 112c which are separated from each other by equal angular intervals. The three pawls 112a to 112c are supported at three points by an annular step section 114 of the third body 56. The flapper 110 is provided to make instantaneous separation from the nozzle 106 in accordance with the action of the resilient force exerted by the pawls 112a to 112c.

A third diaphragm chamber (diaphragm chamber) 116, which is closed by the third diaphragm 100, is formed around the nozzle 106 and the flapper 110. The third diaphragm chamber 116 is provided to make communication with the bleed port 64. A fourth diaphragm chamber 118 is formed between the third diaphragm 100 and the fourth diaphragm 102. The fourth diaphragm chamber 118 is formed to make communication with the secondary port 68 via a first passage 119 (see FIG. 6).

Figure 7:
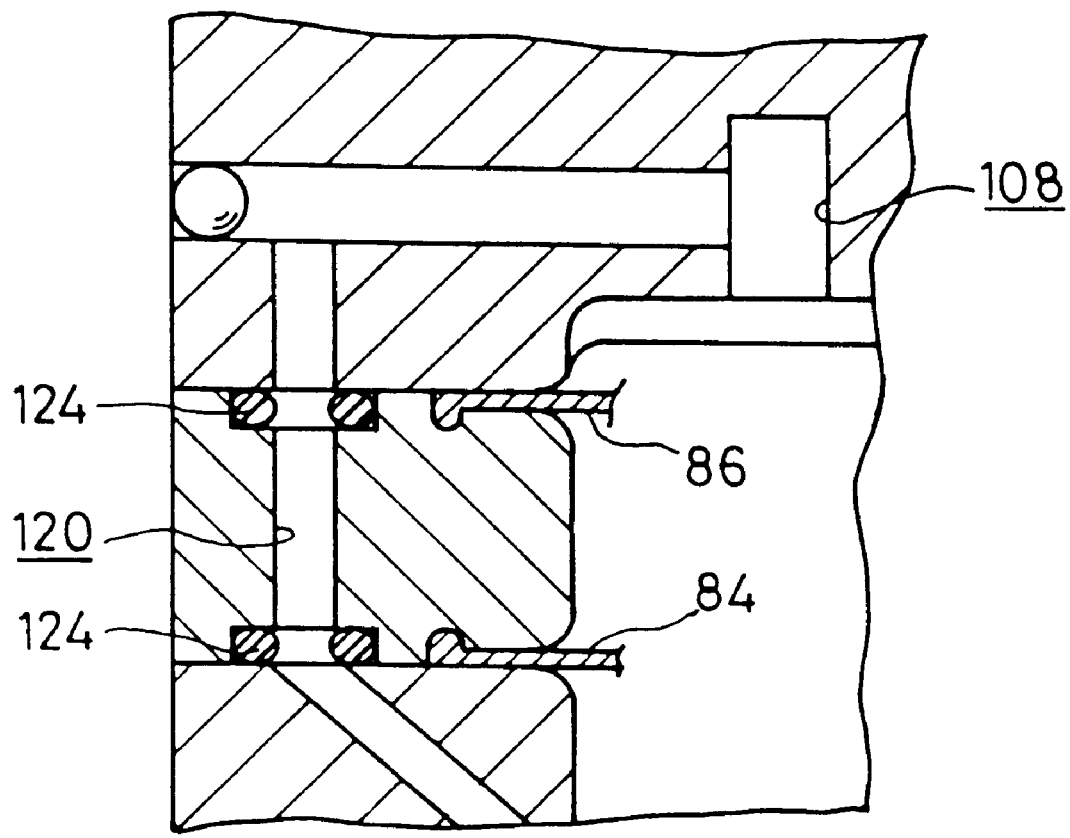
FIG. 7 shows a partial sectional view illustrating the pressure reducing valve shown in FIG. 1.
Figure 10:
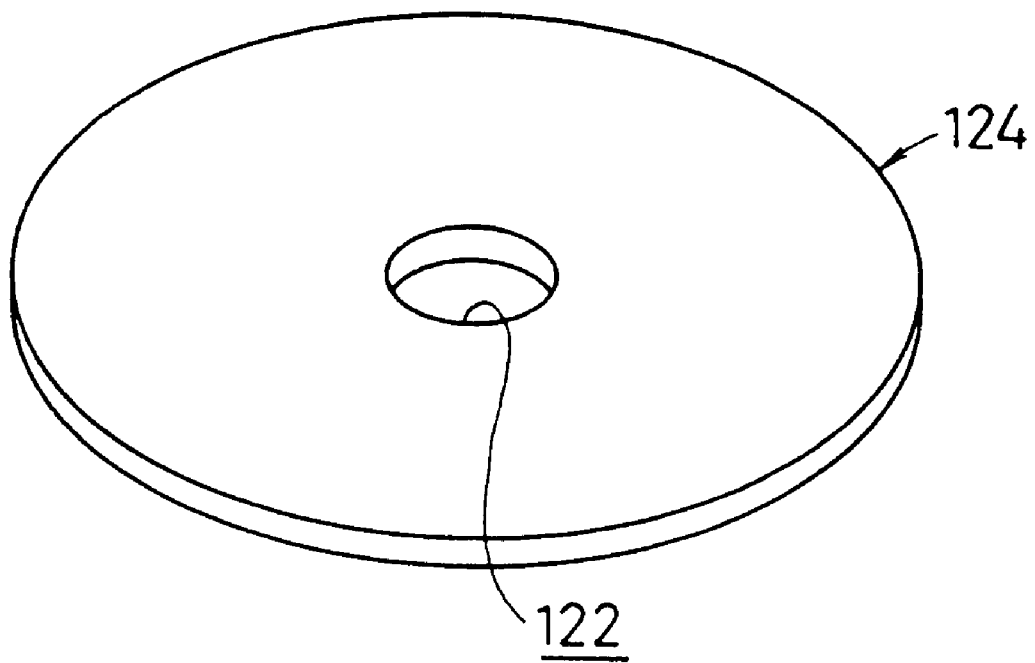
FIG. 10 shows a magnified perspective view illustrating a throttle member shown in FIG. 7.

The nozzle back pressure chamber 108, which is closed by the bottom surface of the third body 56 and the second diaphragm 86, is formed to make communication with the primary port 66 via a second passage 120 (see FIG. 7). In this embodiment, throttle members 124, each of which has a disk-shaped configuration with a small hole 122 formed through its central portion as shown in FIG. 10, are provided in the second passage 120. The small hole 122 functions to throttle the pressurized fluid.

Figure 9:
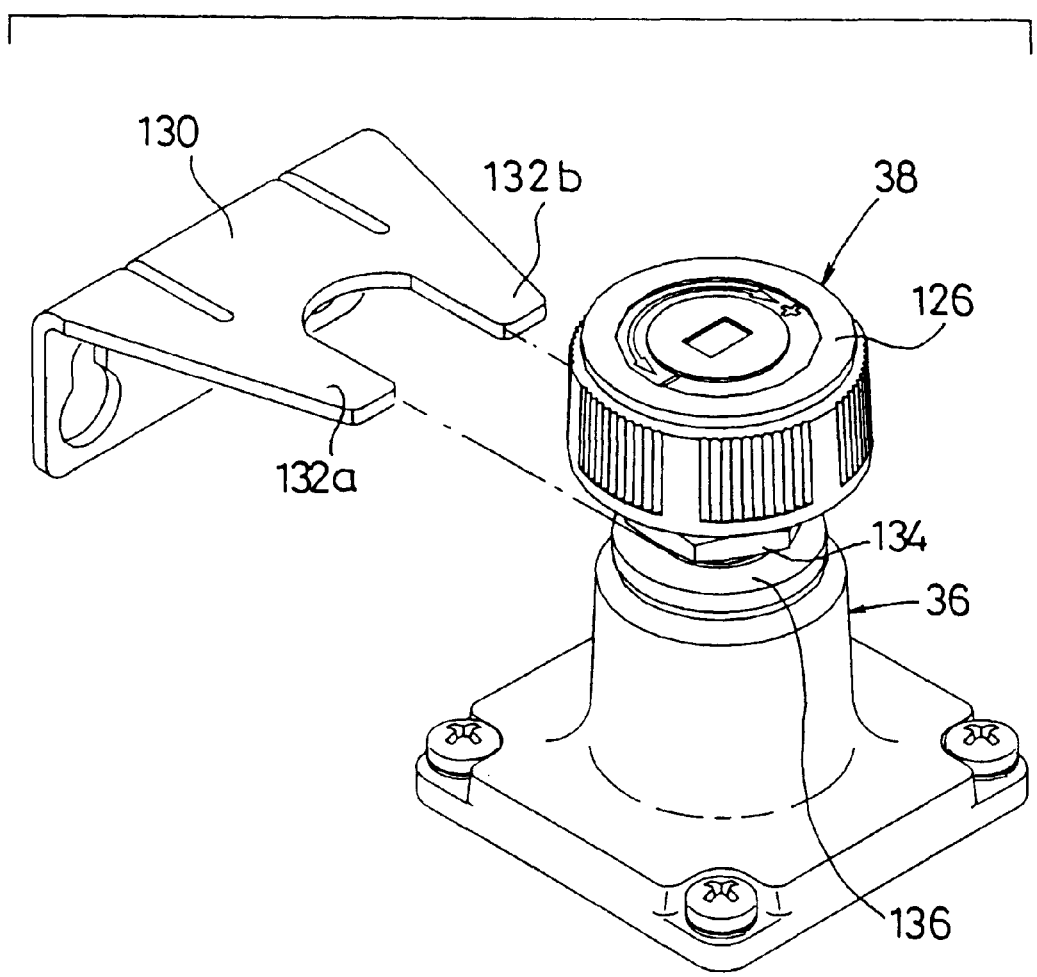
FIG. 9 shows a perspective view illustrating an attachment state of a bracket.

The operating section 38 comprises a handle 126 provided rotatably on the upper portion of the bonnet unit 36, a lock nut 128 for fixing the handle 126, and a ring-shaped nut 134 and a washer 136 for interposing a pair of ends 132a, 132b of a bracket 130 which is formed in a bent configuration to have an L-shaped cross section (see FIG. 9). A receiving member 138, which is engaged with the second spring member 104 to press the second spring member 104 downwardly, is provided at one end of the handle 126.

The pressure reducing valve 30 according to the embodiment of the present invention is basically constructed as described above. Next, its operation, function, and effect will be explained.

At first, the pressurized fluid supply source (not shown) is connected to the primary port 66 via a tube or the like. On the other hand, a desired pressurized fluid-driven apparatus such as a cylinder is connected to the secondary port 68.

After completion of the preparatory operation as described above, the pressure reducing valve 30 is set to be in a state in which a gap is formed between the nozzle 106 and the flapper 110 without rotating the handle 126. That is, the nozzle 106 is separated from the flapper 110 by a predetermined spacing distance without exerting the action of the resilient force of the second spring member 106. In this state, the pressurized fluid, which is supplied from the primary port 66, is introduced into the nozzle back pressure chamber 108 via the second passage 120. The pressurized fluid passes through the gap between the nozzle 106 and the flapper 110, and it is introduced into the third diaphragm chamber 116. The pressurized fluid, which is introduced into the third diaphragm chamber 116, is discharged to the atmospheric air through the bleed port 64.

In such a bleeding state, the handle 126 is rotated in the predetermined direction, and thus the flapper 110 is pressed downwardly by means of the resilient force exerted by the spring member 104 so that the nozzle hole of the nozzle 106 is closed. Therefore, the pressurized fluid, which is supplied from the primary port 66, is introduced into the nozzle back pressure chamber 108 via the second passage 120. Thus, the pressure in the nozzle back pressure chamber 108 (hereinafter referred to as "nozzle back pressure") is increased. The second diaphragm 86 is pressed downwardly in accordance with the action of the nozzle back pressure. The second diaphragm 86, the first diaphragm 84, and the valve plug 50 are displaced downwardly in an integrated manner. The valve plug 50 is separated from the seat section 72, and thus the communicating passage 70 is opened. Accordingly, the primary port 66 is communicated with the secondary port 68.

As a result, the primary pressure can be reduced in accordance with the pressure-regulating action of the first diaphragm 84, and the reduced pressure can be stably supplied to the pressurized fluid-driven apparatus connected to the secondary side.

When the secondary pressure is increased to be not less than a preset pressure, the increased secondary pressure presses the first diaphragm 84 upwardly. The pressurized fluid on the secondary side, which is introduced into the fourth diaphragm chamber 118 via the first passage 119, presses the fourth diaphragm 102 upwardly against the resilient force of the second spring member 104. Therefore, the flapper 110 is separated from the nozzle 106 in accordance with the pressing action of the pressurized fluid on the secondary side. As a result, the pressurized fluid in the nozzle back pressure chamber 108 passes through the gap between the nozzle 106 and the flapper 110, and it is discharged to the atmospheric air via the bleed port 64. Accordingly, it is possible to instantaneously decrease the nozzle back pressure in the nozzle back pressure chamber 108.

When the nozzle back pressure is instantaneously decreased, then the first diaphragm 84 and the second diaphragm 86 are moved upwardly, and the head of the valve plug 50 is separated from the holding metal fixture 92 of the first diaphragm 84. The valve plug 50 is displaced upwardly by means of the resilient force of the damper member 46, and it is seated on the seat section 72. Therefore, the through-hole 94 of the holding metal fixture 92, which has been closed by the head of the valve plug 50, is opened. The increased secondary pressure is supplied to the second diaphragm chamber 90 via the through-hole 94, and it is finally discharged to the atmospheric air through the exhaust port 62.

Figure 13:
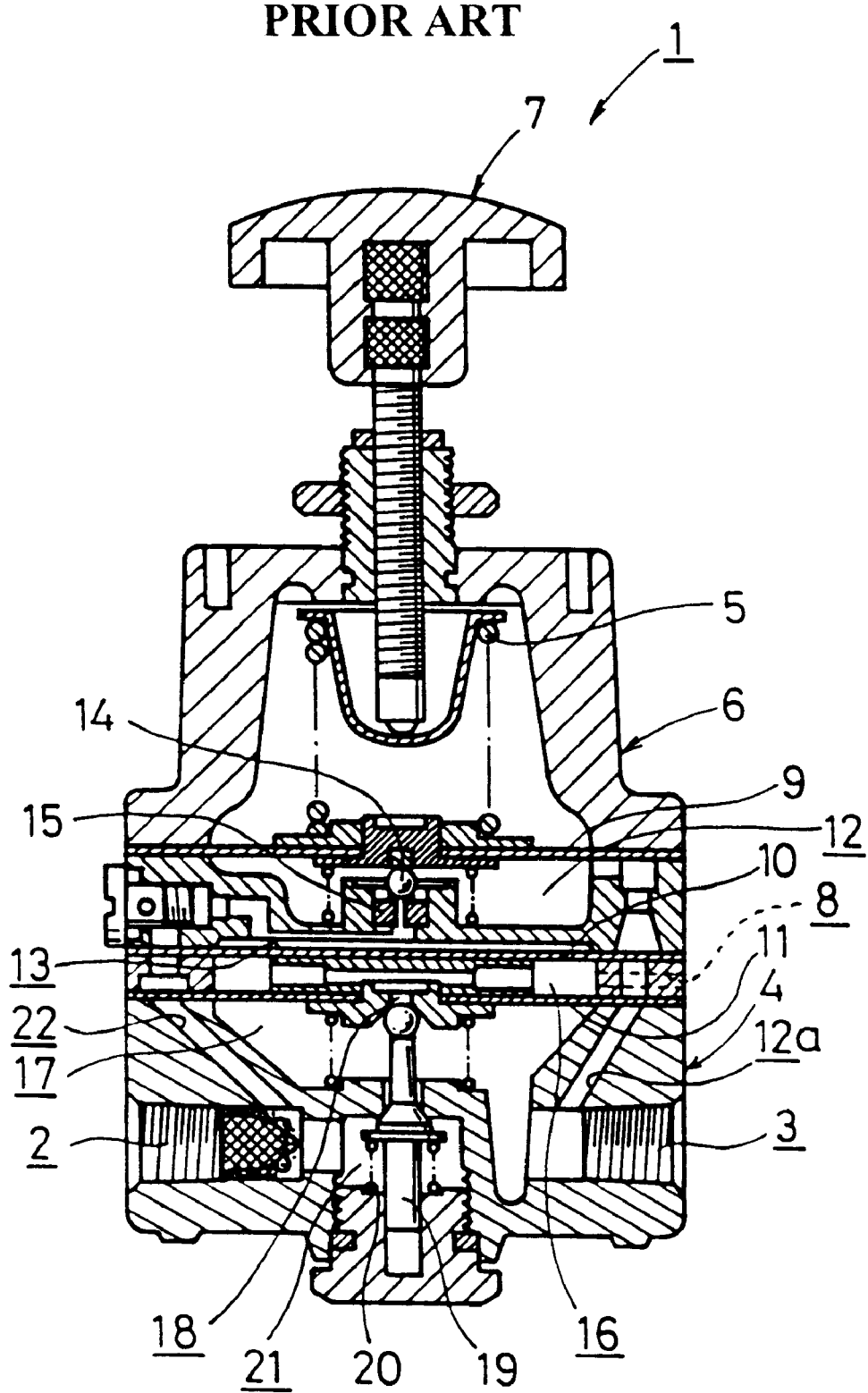
FIG. 13 shows a longitudinal sectional view illustrating a pressure reducing valve having been suggested by the present applicant.

As described above, in the embodiment of the present invention, the bleed port 64 and the exhaust port 62 are formed separately from each other. The excessive pressurized fluid is directly discharged to the atmospheric air without allowing the excessive pressurized fluid to pass through the secondary side. Accordingly, the embodiment of the present invention makes it possible to increase the response speed when the secondary pressurized fluid is discharged to the atmospheric air, further making it possible to much more improve the exhaust characteristics (relief characteristics), as compared with the pressure reducing valve 1 shown in FIG. 13.

That is, the fourth diaphragm chamber 118 is held to have the same pressure as the secondary pressure via the first passage 119. However, the third diaphragm chamber 116, in which the nozzle 106 and the flapper 110 are provided, is excluded from the secondary pressure by the aid of the third diaphragm 100. Further, the third diaphragm chamber 116 is formed to make communication with the atmospheric air via the bleed port 64. Therefore, when the secondary pressure is increased to be not less than the preset pressure, then the pressurized fluid in the nozzle back pressure chamber 108 is allowed to pass through the gap between the nozzle 106 and the flapper 110, and it is directly discharged to the atmospheric air via the bleed port 64. Thus, the nozzle back pressure in the nozzle back pressure chamber 108 can be quickly decreased.

Owing to the fact that the nozzle back pressure is quickly decreased, the displacement amounts of the first diaphragm 84 and the second diaphragm 86 can be set to be large. Further, it is possible to increase the response speed. As a result, the secondary pressurized fluid is discharged to the atmospheric air through the exhaust port 62 and the through-hole 94 of the first diaphragm 84 separated from the head of the valve plug 50.

Figure 11:
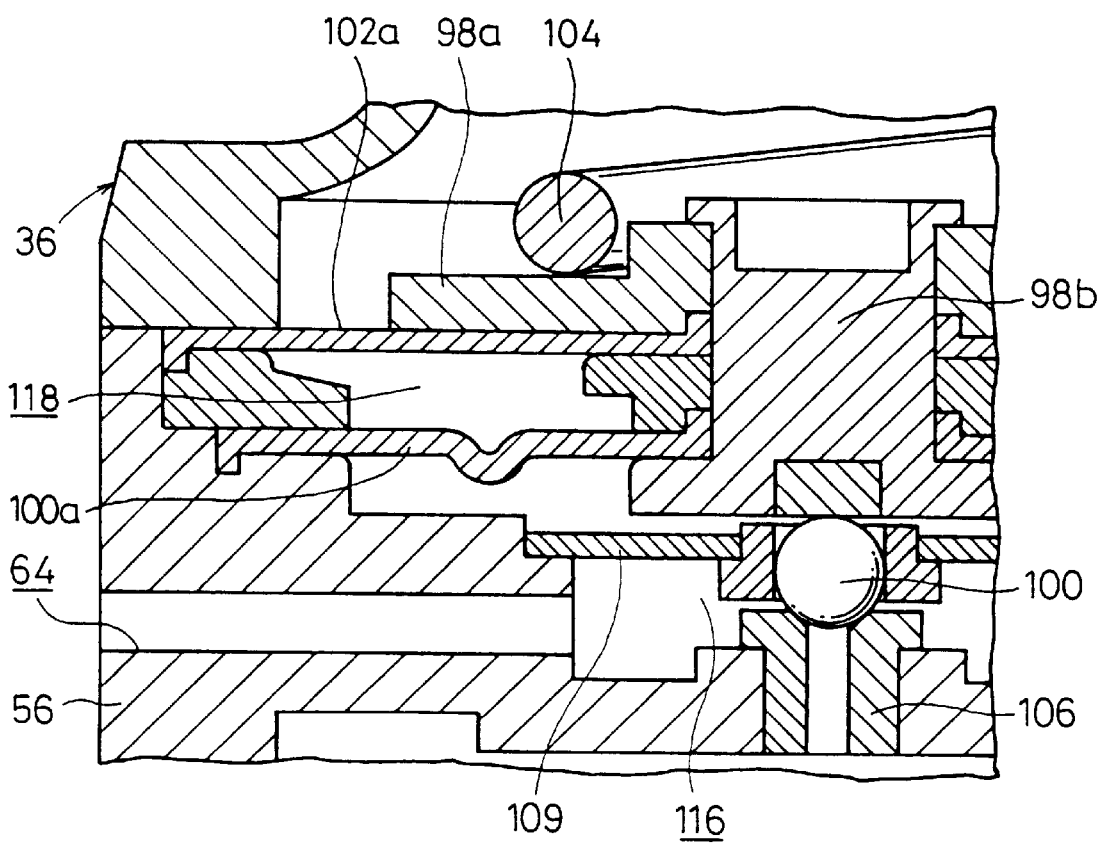
FIG. 11 shows a partial sectional view illustrating a modified embodiment concerning a third diaphragm and a fourth diaphragm for constructing the pressure reducing valve shown in FIG. 1.

As illustrated in a modified embodiment shown in FIG. 11, the pressure-receiving area of the third diaphragm 100a for forming the fourth diaphragm chamber 118 may be approximately the same as that of the fourth diaphragm 102a. Thus, the spring force of the second spring member 104 can be set to be small as compared with the ordinary case. As a result, it is possible to reduce the production cost.

Figure 12:
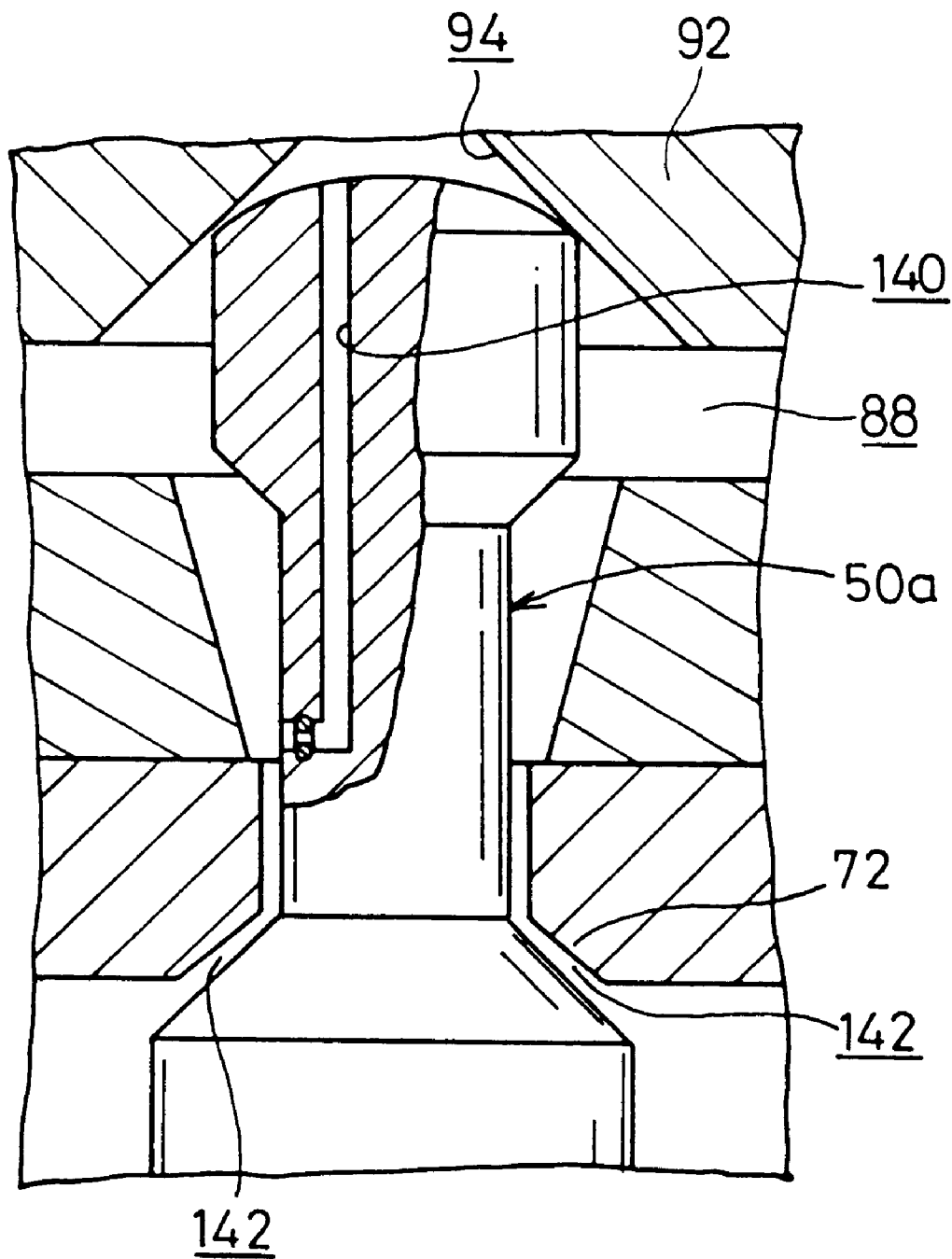
FIG. 12 shows a partial sectional view illustrating a modified embodiment concerning a valve plug for constructing the pressure reducing valve shown in FIG. 1.

As illustrated in a modified embodiment shown in FIG. 12, a passage 140 having an L-shaped cross section may be formed through the valve plug 50a so that the first diaphragm chamber 88 and the second diaphragm chamber 90 are always set to be in a communication state. Further, a gap 142 is formed beforehand between the valve plug 50a and the seat section 72. Thus, the valve plug 50a quickly starts the operation, and it is possible to further increase the response speed.

INDUSTRIAL APPLICABILITY

The pressure reducing valve is constructed such that the bleed port and the exhaust port are formed separately from each other, and the excessive pressurized fluid is directly discharged to the atmospheric air without allowing the excessive pressurized fluid to pass through the secondary side. Thus, the response speed is increased when the secondary pressurized fluid is discharged to the atmospheric air, and it is possible to further improve the exhaust characteristics (relief characteristics).

I claim:

1. A pressure reducing valve comprising:
   a body unit (32) formed to have a rectangular parallelepiped-shaped configuration and have a plurality of pressurized fluid inlet/outlet ports (66, 68);

a bonnet unit (36) integrally coupled to an upper portion of said body unit (32);

an operating unit (38) having a handle (126) provided rotatably on an upper portion of said bonnet unit (32);

a first diaphragm (84), a second diaphragm (86), a third diaphragm (100), and a fourth diaphragm (102) provided to extend in said body unit (32) while being separated from each other by predetermined spacing distances; and a nozzle-flapper mechanism having a nozzle (106) and a flapper (110) arranged in a diaphragm chamber (116) formed between said second diaphragm (86) and said third diaphragm (100), for opening and closing a nozzle hole in accordance with an action of a nozzle back pressure in a nozzle back pressure chamber (108), wherein:

said body unit (32) comprises a primary port (66) on a primary side for connection to a pressurized fluid supply source, a secondary port (68) on a secondary side for supplying a pressurized fluid with a pressure reduced to have a predetermined pressure value, to a pressurized fluid-driven apparatus, a bleed port (64) for discharging an excessive pressurized fluid supplied from said primary port (66), and an exhaust port (62) formed separately and independently from said bleed port (64), for discharging said pressurized fluid on said secondary side having a pressure higher than a preset pressure; and said diaphragm chamber (116) is formed so that it is excluded from pressure on said secondary side by said third diaphragm (100) and it communicates with atmospheric air via said bleed port (64), and when said pressurized fluid on said secondary side has a pressure higher than said preset pressure, said pressurized fluid in said nozzle back pressure chamber (108) is directly discharged to atmospheric air by the aid of said nozzle-flapper mechanism and said bleed port (64).

2. The pressure reducing valve according to claim 1, wherein said flapper (110) is composed of a sphere, said sphere is supported by a hole having a circular cross section of a holding metal fixture (109) having a plurality of pawls (112a to 112c) which are separated from each other by equal angular intervals along a circumferential direction, and said flapper (110) is separated from said nozzle (106) by a predetermined spacing distance in accordance with an action of resilient force of said pawls (112a to 112c).

3. The pressure reducing valve according to claim 1, wherein said body unit (32) has a first body (52), a second body (54), and a third body (56), and said first body (52), said second body (54), and said third body (56) are integrally assembled in a coaxial manner by the aid of screw members (60a to 60d) screwed into screw holes (58) formed at corners.

4. The pressure reducing valve according to claim 1, wherein said third diaphragm is formed to have substantially the same pressure-receiving area as that of said fourth diaphragm.

5. The pressure reducing valve according to claim 1, wherein said handle (126) is provided with a ring-shaped nut (134) and a washer (136), and ends (132a, 132b) of a bracket (130) are interposed and held between said nut (134) and said washer (136).

6. The pressure reducing valve according to claim 1, wherein said body unit (32) is formed with a passage (120) for making communication between said primary port (66) and said nozzle back pressure chamber (108), a disk-shaped member (124) having a small hole (122) with a predetermined diameter formed at a central portion is installed at a predetermined position of said passage (120), and said small hole (122) functions to throttle said pressurized fluid.

7. The pressure reducing valve according to claim 1, wherein a valve plug (50) for opening and closing a communicating passage (70) for making communication between said primary port (66) and said secondary port (68) is arranged in said body unit (32), and said valve plug (50) is provided displaceably by the aid of a cylindrical resilient member (46) externally fitted to said valve plug (50).

8. The pressure reducing valve according to claim 7, wherein a gap (142) is formed between said valve plug (50*a*) and a seat section (72), and said valve plug (50*a*) is formed with a passage (140) for always making communication between a first diaphragm chamber (88) closed by said first diaphragm (84) and a second diaphragm chamber (90) formed between said first diaphragm (84) and said second diaphragm (86).

* * * * *